United States Patent [19]

Schittko et al.

[11] 4,112,375
[45] Sep. 5, 1978

[54] TUNABLE SELECTIVE SUPER HETERODYNE RECEIVER

[75] Inventors: Johannes Schittko, Krailling; Konrad Rauchenecker, Ottobrunn, both of Germany

[73] Assignee: Siemens Aktiengesellschaft, Berlin & Munich, Germany

[21] Appl. No.: 771,966

[22] Filed: Feb. 25, 1977

[30] Foreign Application Priority Data

Mar. 25, 1976 [DE] Fed. Rep. of Germany ....... 2612720

[51] Int. Cl.$^2$ ............................................. H04B 1/32
[52] U.S. Cl. .................................. 325/452; 325/460; 325/489; 325/469
[58] Field of Search ............... 325/452, 458, 460, 461, 325/360, 432, 435, 438, 490, 489, 470, 469, 464, 453; 334/18

[56] References Cited

U.S. PATENT DOCUMENTS

| | | | |
|---|---|---|---|
| 2,902,596 | 9/1959 | Rockwell et al. | 325/460 |
| 2,954,465 | 9/1960 | White | 325/432 |
| 3,696,302 | 10/1972 | Gossard | 325/461 |
| 3,704,423 | 11/1972 | Kadron et al. | 325/458 |
| 3,931,578 | 1/1976 | Gittinger | 325/460 |
| 4,000,470 | 12/1976 | Okada | 325/460 |

*Primary Examiner*—Robert L. Griffin
*Assistant Examiner*—Tommy P. Chin
*Attorney, Agent, or Firm*—Hill, Gross, Simpson, Van Santen, Steadman, Chiara & Simpson

[57] ABSTRACT

A tunable selective heterodyne receiver which receives an input signal and is capable of supplying such input signal through one or two receiving channels and wherein in the first channel a first mixer receives a tunable input from an injection oscillator and supplies it to a second mixer which receives an input from a fixed frequency oscillator and the output of the second mixer comprises a fixed IF and wherein the second receiving channel comprises a third mixer which receives the input signal and also receives an output from a frequency divider which receives the output of the tunable injection oscillator and which has a dividing factor which is determined by the center frequency of a first band pass filter at the output of the first mixer divided by the center frequency of the fixed IF, thus, allowing a receiver tunable over a very broad frequency range.

6 Claims, 3 Drawing Figures

TUNABLE SELECTIVE SUPER HETERODYNE RECEIVER

BACKGROUND OF THE INVENTION

1. Field of the Invention

This invention relates in general to tunable selective heterodyne receivers and in particular to a novel receiver capable of being tuned over a broad frequency range.

2. Description of the Prior Art

Super heterodyne receivers are known which have double or triple frequency conversion and which receive inputs from tunable and fixed frequency oscillators. However, it is desirable to maintain great accuracy of tuning over broad frequency ranges and such prior art receivers are not capable of accomplishing this without undue cost and complexity.

SUMMARY OF THE INVENTION

The present invention comprises a tunable selective heterodyne receiver in which a signal received at the input is fed either through a first receiving channel comprising two or more frequency conversion stages and is thereafter converted into a first and possible further intermediate frequency bands. The frequency range over which the received signal can encompass is referred to as the tuning range of the heterodyne receiver.

So as to avoid reception of undesired image frequencies, in other words, frequencies which exceed the tuning range by twice the amount of the first intermediate frequency, the first intermediate frequency is generally selected so as to be such that it lies above the tuning range. The tuning range can, for example, be increased by a factor of four relative to the upper limit of the tuning range and the relatively large spacing between tuning range and the image frequency band which is thereby achieved can be utilized by installing a low-pass filter prior to the first frequency conversion stage which has a cut-off frequency that lies between the tuning range and the first intermediate frequency and the image frequency band is designed with low cost components so as to (1) exhibit a high blocking attenuation due to the requisite image wave safeguard, and (2) so as to have a pass band curve which is as flat as possible.

The first frequency conversion stage receives an input from an adjustable injection oscillator so as to enable the heterodyne receiver to be tuned to an arbitrary signal. With a given tuning range, the injection oscillator must be variable between the following limits: the lower limit must exceed the first intermediate frequency by the amount of the lower tuning range limit and the upper frequency limit must exceed the first intermediate frequency by an amount of the upper tuning range limit. The high frequency position of the first injection oscillator may have an unstable frequency which in the case of a quartz-controlled oscillator amounts to $1.10^{-5}$ which becomes very noticeably in the conversion of signals from the lower and the lowest part of the tuning range. If the first intermediate frequency is selected, for example, to be 24 MHz and the lower limit of the tuning range is selected to be at 10 kHz using a conversion signal of 10 kHz will result in frequency instability of about 240 Hz. Relative to 10 kHz, this represents a frequency error of 2.4%. If the tuning range is extended downwardly to approximately 1 kHz in the case of frequency conversion of a 1 kHz signal, a frequency error of 24% would occur which in practice cannot be tolerated for most applications.

Thus, the tuning range of a heterodyne receiver is governed by a lower limit which results from the allowable frequency error that can be tolerated in the conversion and from the frequency position of the first injection oscillator. It will be obvious that in particular receivers of high selectivity will require constant retuning to prevent the frequency error remaining within permissible limits or alternatively to limit the frequency range so as to enable a signal connected at the input to be nevertheless satisfactorily received.

If the amplitude of the received signal which is to be measured by an analyzing device connected to the output of the heterodyne receiver and which might for example, be a level indicating meter, a frequency error will produce an error in the assigned measured amplitude values corresponding to the signal frequency. If the maximum permissible frequency error is overshot, it is not possible to accomplish an automatic stepped switch-over of the receiver to a given band of measuring frequencies.

The object of the present invention is to extend the tuning range of a heterodyne receiver which range is governed by the limitations and conditions listed above such that the tuning range is extended in the lower frequency range without requiring increased frequency unreliability during conversion of the received signal.

The advantage which is achieved with the invention consists particularly in that despite the fact that the tuning range is extended by a considerable degree in the direction toward lower frequencies, the frequency error which corresponds to the lower limit of the normal tuning range is not exceeded. A further advantage consists in that noise voltages which are produced by the injection oscillators and which are more prominent in amplitude in the vicinity of the exciting frequency and in the case of lower tuning frequencies fall increasingly into the pass band of the heterodyne receiver are less apparent than in conventional heterodyne receivers.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
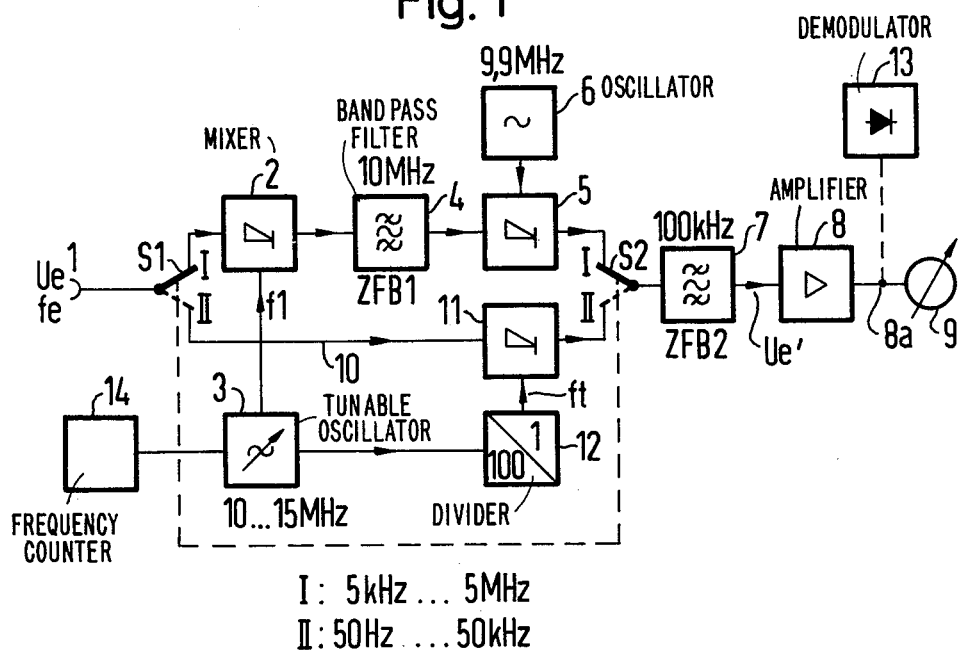
FIG. 1 is a schematic diagram of the invention using double frequency conversion.

FIG. 1 illustrates an input terminal 1 of a heterodyne receiver to which is supplied an input signal $U_e$ at a frequency of $f_e$ and which is connected to the movable contact of a switch S1 which can be moved to a first position I or a second position II. When the switch is in the first position I, it supplies the input signal to a first mixer 2 which also receives an injection frequency $f_1$ from an injection tunable oscillator 3 at a frequency of $f_1$. A band pass filter ZFB1 has a center frequency which is equal to the difference between the input signal and the output frequency of the oscillator 3 and supplies an output to a second mixer 5 which also receives an input signal at a frequency of $f_2$ from a fixed frequency injection oscillator 6. A second change-over switch S2 has a first position I where its movable contact is connected to the output of the mixer 5 and supplies an input to a second IF ZFB2 designated by 7 which supplies an output signal $Ue'$ to an amplifier 8 which supplies an output to terminal 8a that is connected to a voltmeter 9. When the input signals passes through the mixer 2, the IF 4, the mixer 5 and the IF 7 and amplifier 8 the signal is defined as passing through a first receiving channel of the heterodyne receiver.

The switches S1 and S2 are ganged together and are moveable to second positions II at which time the input signal at terminal 1 is supplied through switch S1, lead 10 to a mixer 11 which receives an injection frequency from a divider 12 that receives an input from the tunable injection oscillator 3. The output of the mixer 11 is supplied through the switch S2 to the IF ZFB2 designated by 7 and to the amplifier 8 and the voltmeter 9. The channel including the mixer 11, the IF 7 and the amplifier 8 is designated the second receiving channel of the heterodyne receiver.

It is to be realized that when the switches S1 and S2 are in the position I, the heterodyne receiver is tuned by adjusting the output frequencies of the tuning injection oscillator 3 so as to allow inputs signals at frequencies $fe$ at the input 1 to fall within the tuning range. The signal $Ue$ is first converted into a first intermediate frequency band ZFB1 which is selected by the pass band of the band pass filter 4 and then is converted into a second intermediate frequency band ZFB2 which is determined by the frequency of the band pass filter 7. The signal $Ue'$ at the output of the filter 7 which has been frequency converted and selected in this manner is amplified in the IF amplifier 8 and is then passed to the voltmeter 9 which allows it to be analyzed relative to its amplitude. Assuming that the first carrier oscillator 3 is variable between the frequencies of 10 and 15 MHz and that the center frequency of the first intermediate frequency band filter 4, ZFB1 is 10 MHz the input tuning range of the heterodyne receiver extends between the ranges from 5 kHz to 5 MHz with the lower limit of the tuning range being calculated from a maximum permissible frequency error of 2% with a frequency instability of the injection oscillator 3 of approximately $1.10^{-5}$ which is 100 Hz. A frequency of $f_2$ of 9.9 MHz supplied by the injection oscillator 6 produces a further frequency conversion of the input signal $Ue$ into a second intermediate frequency band of ZFB2 which has a middle frequency (center frequency) of 100 kHz.

So as to extend the tuning range to lower frequencies, the change-over switches S1 and S2 are moved to the switching position II. Then the input signal $Ue$ at a frequency of $fe$ bypasses the mixer stages 2 and 5 of the first receiving channel and is mixed in mixer 11 with the injection signal at a frequency of $ft$ after which it is fed through switch S2 to the band pass filter 7 and is then furnished as signal $Ue'$ to the amplifier 8 and the voltmeter 9. In order for the signal $Ue'$ to pass through the intermediate frequency band pass filter ZFB2 indicated by 7 which has a mid-frequency of 100 kHz the frequency $ft$ out of the divider 12 must lie below $f_1$ by division factor which corresponds to the decrease in frequency caused by the mixer 2 and the IF 4 in the first receiving signals and which is eliminated in the second receiving channel. In a specific example utilizing the frequencies indicated in FIG. 1 for the different components wherein the center frequency of the filter 4 was 10 MHz and where the center frequency of the filter 7 was 100 kHz a dividing factor of the divider 12 was 100 which is equal to 10 MHz divided by 100 kHz. When the heterodyne receiver is operating under these conditions the frequency $fe$ obtained covers a tuning range with a lower limit of 50 Hz if a relative frequency error of 2% which in this case is equal to 1 Hz is allowed. This value is derived from the frequency instability of the injection oscillator 3 of $1.10^{-5}$ which is reduced by the divider 12 to 1 Hz. The upper limit of the tuning range lies at one half of the value of the first intermediate frequency obtained in this situation and amounts to 50 kHz.

The tuning frequency can be observed in the position of switches S1 and S2 in position I on a tuning scale dial associated with the injection oscillator 3. However, the same scale can also be utilized for the position of switches S1 and S2 in II if the readout scale values are multiplied by the division factor of the divider 12 or more generally with the intermediate frequency reduction in that part of the first receiving channel which is replaced by the second receiving channel. If a division factor of $10^n$ is utilized, it is merely necessary to displace the decimal point of the read-out scale value. In the event of a digital display of the tuning frequency, the frequency of the injection oscillator 3 is counted in a frequency counter 14 which is connected to the oscillator 3 as shown and the constant frequency displacement of the tuning frequency relative to the frequency $f_1$ is taken into consideration in the conventional manner by means of presetting of the counter 14. On switch-over to operating situation II it is necessary to carry out a corresponding displacement of the decimal point. Similarly, the frequency $ft$ occurring at the output of the decade divider 12 can also be counted by means of a preset counter for the purpose of digital display of the tuning frequency.

The converted and selected signal $Ue'$ can also be analyzed with regard to its phase with a phase meter, or in the event that it is being used as a carrier for the purposes of communication transmission and is modulated, it can be fed from the output point 8a of the intermediate frequency amplifier 8 to a device 13 operating in the intermediate or low frequency range comprising a demodulator.

As a variation from the exemplary embodiment illustrated in FIG. 1, the injection voltage of the frequency $ft$ can also be produced by a separate oscillator rather than utilizing the divider 12 in which case the tuning frequency in operating situation II can be read on a scale assigned to the second injection oscillator or it can be digitally displayed when the output frequency of this injection oscillator has been counted.

Figure 2:
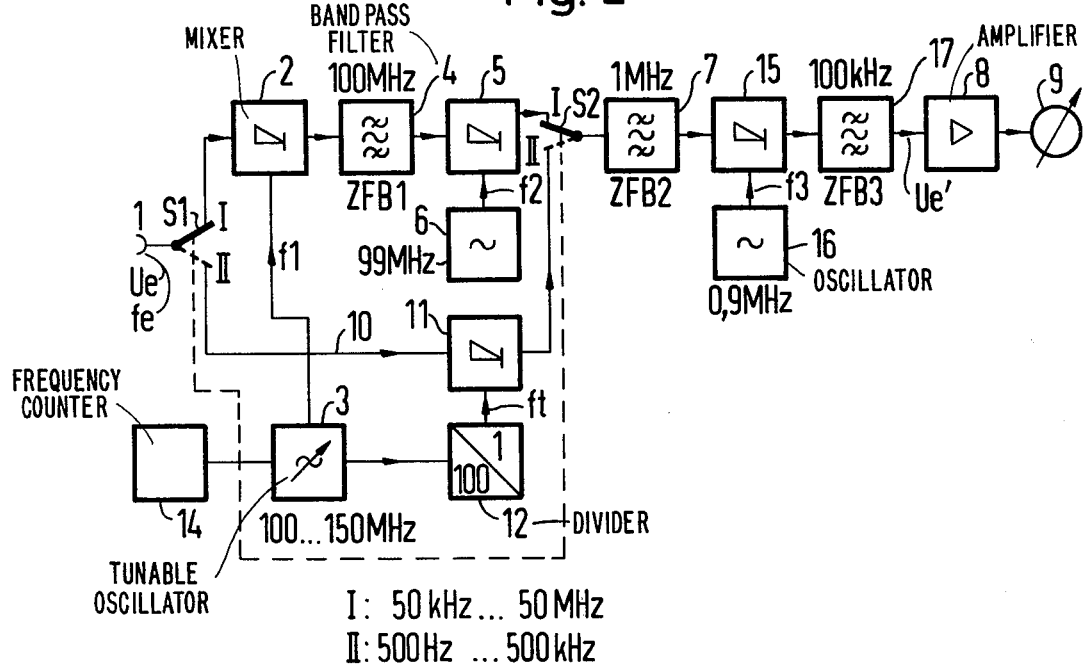
FIG. 2 illustrates a modification of the invention utilizing triple conversion.

FIG. 2 illustrates a modification of the embodiment of FIG. 1, wherein between the band pass filter 7 and the amplifier 8, there are mounted a mixer 15 which receives an injection frequency from an oscillator 16 as well as the output of the filter 7. The mixer 15 supplies an output to a third IF band pass filter 17 which has a center frequency of ZFB3. The injection frequency of the oscillator 6 is selected to be 99 MHz and the band pass filter 7 has a center frequency of 1 MHz and the filter 17 has a band pass of 100 kHz. The injection oscillator 16 supplies a frequency $f_3$ of 0.9 MHz. With the frequency ranges selected and illustrated in FIG. 2 with the switches S1 and S2 in position I, the tuning range is from 50 kHz to 50 MHz. With the switches S1 and S2 in position II, a tuning range is covered from 500 Hz to 50 kHz. It is to be noted in FIG. 2 that the injection oscillator 3 is tunable from 100 to 150 MHz as shown in the Figure.

Figure 3:
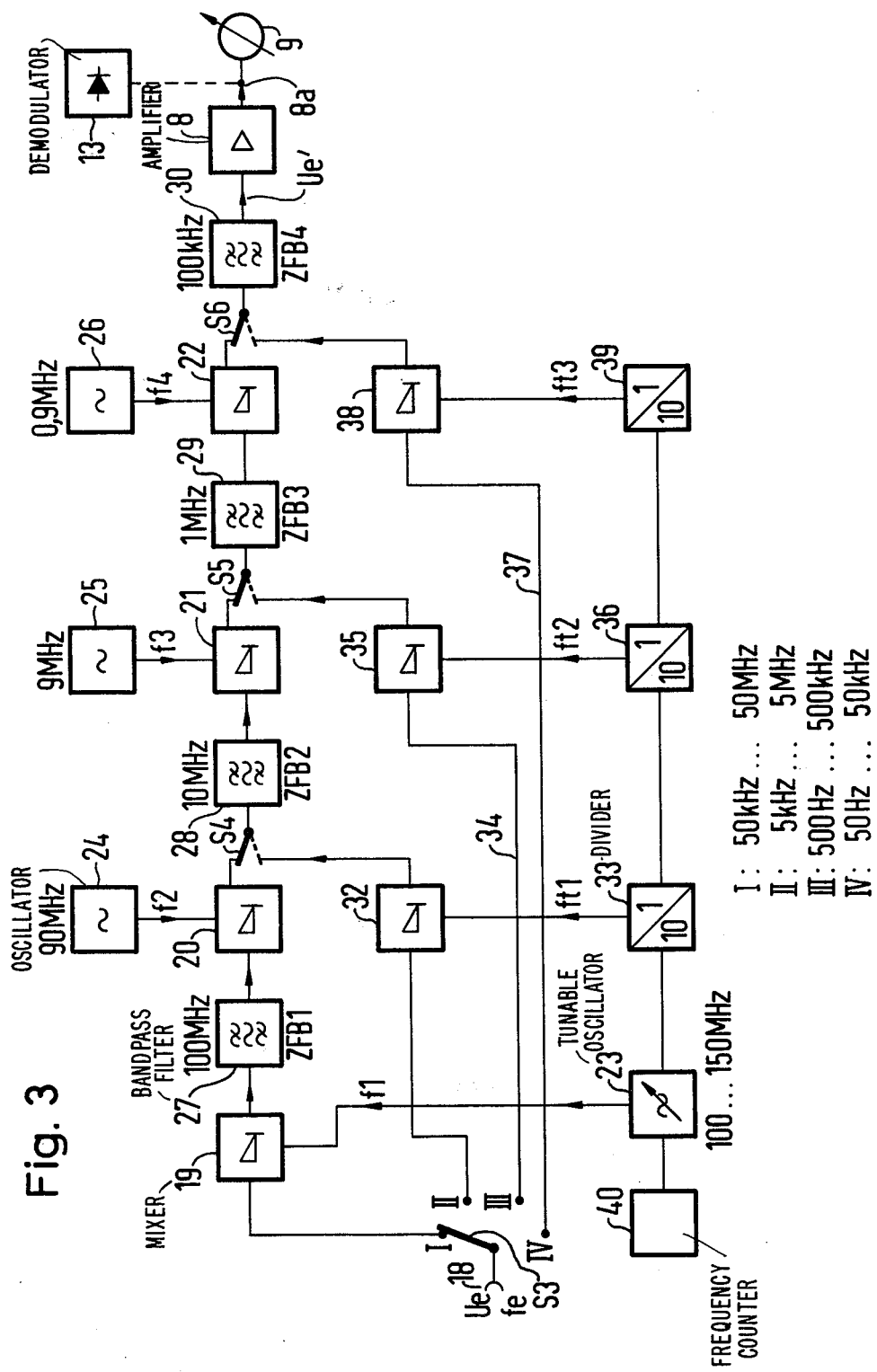
FIG. 3 illustrates a further modification of the invention utilizing four frequency conversion stages.

FIG. 3 illustrates a modification of the invention, wherein four separate receiving channels are provided wherein the second, third and fourth channels selectively replace different portions of the first receiving channel. An input at terminal 18 $Ue$ at a frequency of $fe$ is supplied to movable contact of a switch S3 which is connectable to switching positions I through IV which correspond to the four receiving channels. The first receiving channel comprises a first mixer 19 which receives an injection frequency at a frequency $f1$ from a tunable oscillator 23 which in a particular example might be tunable from a 100 to 150 MHz. A first IF filter 27 having a center frequency of 100 MHz designated ZFB1 receives the output of the mixer 19 and supplies the difference frequency to a mixer 20 which also receives an injection frequency at a frequency of $f2$ from injection oscillator 24 at an injection frequency of 90 MHz for example. A switch S4 has a movable contact that in a first position connects the output of mixer 20 to a second IF 28 which has a center frequency ZFB2 which might be at 10 MHz. The output of the filter 28 is supplied to a mixer 21 which also receives an injection frequency $f3$ from an injection oscillator 25 which might have a frequency of 9 MHz. A switch S5 in a first position connects the output of mixer 21 to a third band pass filter 29 which has a pass band ZFB3 at a frequency of 1 MHz. A fourth mixer 22 receives the output of the filter 29 and receives an injection frequency $f4$ from an oscillator 26 which might be at a frequency of 0.9 MHz. A switch S6 in a first position supplies the output of the mixer 22 to a fourth band pass filter 30 which has a center frequency ZFB4 which in a particular example might be at 100 kHz. The output of filter 30 is designated $Ue'$ and is supplied to an amplifier 8 which is connected to a voltmeter 9. Thus, the first receiving channel comprises the elements 19, 27, 23, 24, 20, 10, 25, 21, 29, 26, 22, 30 and 8. The second receiving channel is operated when the switch S3 is moved to engage the position II so that the signal $fe$ is supplied to a mixer 32 and the switch S4 is moved to supply the output of the mixer 32 to the filter 28. The mixer 32 receives an input from a frequency divider 33 at a frequency of $ft1$ which comprises the output of the oscillator 23 divided by a dividing factor which in a particular example illustrated is 10 to 1. Thus, receiver channel II comprises the mixer 32, the divider 33, the oscillator 23, the element 28, 21, 25, 29, 22, 26, 30 and 8.

The third receiving channel is operated when the switch S3 is moved to III position such that lead 34 supplies the input signal $fe$ to a mixer 35 and the switch S5 is moved so that the output of the mixer 35 is supplied to the filter 29. A divider 36 supplies an input frequency signal at a frequency $ft2$ to the mixer 35. The divider 36 receives the output of the divider 33 and divides it by a factor 10 to 1 in the specific example illustrated in FIG. 3. Thus, the receiving channel III comprises the mixer 35, the divider 36, the divider 33 and the oscillator 23 as well as the elements 29, 22, 26, 30 and amplifier 8.

The fourth receiving channel is operated when the switch S3 is moved to position IV to supply the input signal $fe$ to lead 37 which supplies an input to a mixer 38 which supplies its output through switch S6 to band pass filter 30 and through the band pass filter 30 and amplifier 8 to signal measuring means 9.

The mixer 38 receives an input $ft3$ from a divider 39 which receives an input from the divider 36 and in the specific example illustrated the divider 39 has a dividing factor of 10 to 1. The receiver channel IV comprises the mixer 38 the dividers 39, 36, 33 and oscillator 23 as well as the filter 30 and the amplifier 8. Receiver channel I allows the receiver to be tuned to accept signals from 50 kHz to 50 MHz. The receiver channel II allows the signals to be received from 5 kHz to 5 MHz. The receiver channel III allows signals to be received from 500 Hz to 500 kHz. Receiving channel IV allows signals to be received from 50 Hz to 50 kHz.

With the specific example illustrated in FIG. 3, the signal $ft3$ must be lower than $f1$ by a division factor of 1000. If a divider chain composed of the frequency dividers 33 and 36 and one further frequency divider 39 is provided each of these dividers can be selected to have a division factor of 10. In the examples given in FIG. 3, the frequency error in any of the channels which occurs at the lower limit of the tuning range is within desirable limits. In the embodiment of FIG. 3, the particular tuning frequency of the heterodyne receiver can be read off on tuning scales assigned to the injection oscillator 23 or can be determined by means of a counter 40 which counts $f1$ and digitally displays the output. If the frequency dividers 33, 36 and 39 have division factors of $10^n$ the carrier frequencies $ft1$, $ft2$ or $ft3$ can be counted instead of $f1$.

In the event of an increase in the number of conversion and mixer stages in the first receiving channel, it is also possible to provide further receiving channels in which case any arbitrary number of mixer stages of the first receiving channel can be selectively replaced by a further receiving channel. The injection oscillators 25 and 26 can also be replaced by a frequency divider chain which derives the injection frequencies $f3$ and $f4$ from the signals $f2$ at the output of the oscillator 24.

Although this invention has been described with respect to preferred embodiments, it is not to be so limited, as changes and modifications may be made which are within the full intended scope as defined by the appended claims.

We claim as our invention:

1. A receiver comprising an input terminal, a first switch, a first mixer connectible by said first switch to said input terminal, a first tunable injection oscillator supplying an input to said first mixer, a first band pass filter connected to the output of said first mixer, a second injection oscillator, a second mixer receiving inputs from said first band pass filter and said second injection oscillator, a second switch, a second band pass filter connectible by said second switch to the output of said second mixer, signal measuring means connected to the output of said second band pass filter, a third mixer connectible by said first switch to receive an input from said input terminal and its output connectible by said second switch to supply its output to said second band pass filter, and a divider supplying an input to said third mixer and receiving an input from said first tunable injection oscillator and wherein the dividing factor of said divider is equal to the center frequency of said first band pass filter divided by the center frequency of said second band pass filter.

2. A receiver according to claim 1 further including a fourth mixer, a third injection oscillator and a third band pass filter connected between the output of said second band pass filter and said signal measuring means and wherein said fourth mixer receives inputs from said third injection oscillator and said second band pass filter and supplies an output to said third band pass filter, and said third band pass filter supplies an output to said signal measuring means.

3. A receiver according to claim 1 further including a fourth mixer, a third band pass filter, a third injection oscillator, and a third switch with said second band pass filter supplying an input to said fourth mixer, said fourth mixer supplying an output to said signal measuring means, said third injection oscillator supplying an input to said fourth mixer, a fifth mixer connectible by said first switch to said input terminal, a second divider supplying an input to said fifth mixer and receiving an input from said divider and the dividing factor of said second divider being the center frequency of said second band pass filter divided by said third band pass filter, and said third switch connecting the input of said third band pass filter to the output of said fourth mixer or to the output of said fifth mixer.

4. A receiver according to claim 3 further including a sixth mixer, a fourth band pass filter, a fourth injection oscillator and a fourth switch with said third band pass filter and said fourth injection oscillator supplying inputs to said sixth mixer, a seventh mixer connectible by said first switch to said input terminal, a third divider supplying an input to said seventh mixer and receiving an input from said second divider, and said fourth switch connecting the input of said fourth band pass filter to the output of said sixth or said seventh mixer.

5. A tunable selective heterodyne receiver comprising an input terminal, a first receiving channel including a first mixer a first switch for connecting said first mixer to said input terminal, a first tunable oscillator connected to supply an input to said first mixer, a first band pass filter with a fixed center frequency connected to the output of said first mixer, a second mixer receiving the output of said first band pass filter, a second oscillator supplying an input to said second mixer, a second switch connected to said second mixers output, a third mixer with its input connected to said first switch and its output connected to said second switch, a second band pass filter with a fixed center frequency connected to said second switch, output means connected to the output of said second band pass filter, and a divider receiving an output of said first tunable oscillator and supplying an input to said third mixer and the dividing factor of said divider being equal to the center frequency of said first band pass filter divided by said center frequency of said second band pass filter.

6. A tunable selective receiver according to claim 5 wherein said first switch has a plurality of contacts so as to connect said input terminal to said first or third mixers or to addition stages wherein each of said additional stages (34, 37) comprise additional mixers (35, 38) and additional dividers (36, 39), a fourth mixer (21) connected to the output of said second band pass filter, a third oscillator (25) connected to said fourth mixer, a fifth mixer (35) connected to said first switch, a third switch connected to said fourth and fifth mixers, a third band pass filter (ZFB3) with a fixed center frequency connected to said third switch, and a second divider receiving the output of said first divider and supplying an input to said fifth mixer (35), and the dividing factor of said second divider is equal to the center frequency of said second pass filter divider by the center frequency of said third band pass filter.

* * * * *